(12) United States Patent
Le Vaillant

(10) Patent No.: US 7,887,936 B2
(45) Date of Patent: Feb. 15, 2011

(54) SUBSTRATE WITH DETERMINATE THERMAL EXPANSION COEFFICIENT

(75) Inventor: Yves-Matthieu Le Vaillant, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 353 days.

(21) Appl. No.: 11/472,663

(22) Filed: Jun. 21, 2006

(65) Prior Publication Data
US 2006/0240644 A1 Oct. 26, 2006

Related U.S. Application Data

(63) Continuation of application No. PCT/IB2004/003762, filed on Oct. 28, 2004.

(30) Foreign Application Priority Data

Jan. 9, 2004 (FR) .................................. 04 00175

(51) Int. Cl.
*B32B 9/04* (2006.01)
*B32B 13/04* (2006.01)
*B32B 9/00* (2006.01)
*B32B 19/00* (2006.01)

(52) U.S. Cl. .................... 428/701; 428/446; 428/698

(58) Field of Classification Search .............. 117/58, 117/63, 90, 101; 428/698, 446, 701
See application file for complete search history.

(56) References Cited

U.S. PATENT DOCUMENTS

| 5,512,375 | A | 4/1996 | Green et al. ............... 428/426 |
| 6,100,166 | A | 8/2000 | Sakaguchi et al. .......... 438/455 |
| 6,756,285 | B1 | 6/2004 | Moriceau et al. ............ 438/455 |
| 2001/0012678 | A1 * | 8/2001 | Tanaka et al. ............... 438/481 |
| 2002/0096106 | A1 * | 7/2002 | Kub et al. ..................... 117/94 |

(Continued)

FOREIGN PATENT DOCUMENTS

| EP | 0 849 788 B1 | 6/1998 |
| WO | WO 00/48238 | 8/2000 |
| WO | WO 00/48239 | 8/2000 |
| WO | WO-02-064864 | * 8/2002 |

OTHER PUBLICATIONS

Machine translation of JP-08-188408 (1996), Provided by the JPO website.*

(Continued)

*Primary Examiner*—Jennifer C McNeil
*Assistant Examiner*—Jonathan C Langman
(74) *Attorney, Agent, or Firm*—Winston & Strawn LLP

(57) ABSTRACT

A composite support designed to successfully receive a transfer layer made of a crystalline material so that the assembly forms an epitaxy substrate, with the support having a longitudinal plane of symmetry parallel to its principal surfaces and a plurality of layers. The support includes a central first layer having a first thermal expansion coefficient at a specified temperature T and extending transversely on either side of the plane of symmetry and at least one pair of lateral layers. The layers of each pair, one with respect to the other, have arrangements in the composite support that are substantially symmetrical with respect to the plane of symmetry; second thermal expansion coefficients at the temperature T that are substantially identical to one another; and thicknesses that are substantially identical to one another. The layers of the support are made of materials that are chosen in such a way that the composite support has an overall thermal expansion coefficient at the temperature T that is sufficiently close to the thermal expansion coefficient of the material of the transferred layer at the temperature T to avoid generating an excessive number of defects in the transfer layer.

15 Claims, 3 Drawing Sheets

U.S. PATENT DOCUMENTS

| | | | |
|---|---|---|---|
| 2002/0195602 A1* | 12/2002 | Klosowiak | 257/55 |
| 2003/0017626 A1 | 1/2003 | Hilt et al. | 438/3 |
| 2003/0033974 A1 | 2/2003 | Ueda | 117/84 |
| 2003/0064535 A1* | 4/2003 | Kub et al. | 438/22 |
| 2004/0123796 A1* | 7/2004 | Nagai et al. | 117/103 |

OTHER PUBLICATIONS

Tsuchiya ("Influence of As Autodoping from GaAs substrates on Thick Cubic GaN Growth by HVPE"). Japanese Journal of Applied Physics, Part 2, No. 5B, May 1998. pp. L568-L570).*

Q.-Y Tong and U. Gosele, "Semiconductor Wafer Bonding, Science and Technology" John Wiley & Sons, pp. 1-15 and 81-99.

C. Maleville et al., "Detailed Characterization Of Wafer Bonding Mechanisms" Electrochemical Society Proceedings, vol. 97-36, pp. 46-55 (1997).

Colinge, J. P., "Silicon-On-Insulator Technology", Materials to VLSI, 2nd Edition, pp. 50-51 (1997).

Q.-Y Tong and U. Gosele, "Semiconductor Wafer Bonding" (1999), John Wiley & Sons, pp. 10-12 and 51-53.

* cited by examiner

SUBSTRATE WITH DETERMINATE THERMAL EXPANSION COEFFICIENT

CROSS-REFERENCE TO RELATED APPLICATION

This application is a continuation of International application PCT/IB2004/003762 filed Oct. 28, 2004, the entire content of which is expressly incorporated herein by reference thereto.

TECHNICAL FIELD

The present invention relates to a substrate for supporting an epitaxially grown useful layer of a semiconductor material. A substrate is closely tied to the useful layer that it supports, and it may thus have a considerable influence on the structure of the useful layer, especially from a number of aspects.

According to a first aspect, the crystal structure of the epitaxy substrate in the vicinity of its interface with the useful layer to be grown, and more particularly the crystalline nature and the lattice parameter that the substrate has at this point, can strongly influence the crystal structure of the useful layer. This aspect is particularly made use of during epitaxy of a useful layer on the substrate, during which the lattice parameter of the useful layer is in registration with the lattice parameter of the substrate. In order not to generate an excessive number of defects in the thin layers to be grown, the epitaxy substrate must therefore have, at least on the surface, a lattice parameter close to that of the constituent material of the useful layer that is being grown thereon.

According to a second aspect, the constituent material of the epitaxy substrate must not have a thermal expansion coefficient too different from that of the useful layer, at the working temperatures. The term "working temperatures" is understood to mean the temperatures to which the substrate/useful layer assembly is subjected during the industrial process involved, which includes in particular ambient temperature, the useful layer formation temperatures and other heat treatment temperatures. Too great a difference in expansion coefficient between the materials of the substrate and the useful layer induces in the useful layer high internal strains (in tension or in compression) that are liable to degrade the structural quality of the layer. The constituent material of the epitaxy substrate must therefore be chosen so that the substrate has an overall thermal expansion coefficient, at the working temperatures, that is close to that of the material of the useful layer to be grown.

In the case of a bulk substrate made of a single material, the crystal and thermal expansion properties cannot be separated and may not both correspond to the intended application. The choice of the material of the useful layer to be grown is therefore very much limited to the possible choices of the constituent material of the bulk substrate. Furthermore, the applications of the components to be produced, the performance of which depends strongly on the material and on the structure of the useful layer in which they have been produced, are thereby more restricted. Thus, a given material and a given structure may be chosen for the useful layer, for the purpose of obtaining a given band gap and a given lattice parameter, this being, for example, highly desirable in the field of Group III-V alloys such as gallium arsenide or gallium nitride.

Solutions to the problem of choosing a suitable substrate have included the production of composite epitaxy substrates, where a combination of several layers forms a crystallographic structure that makes it possible to match a desired lattice parameter at the interface with the useful layer to be formed and/or to confine plastic defects. Multilayer structures have thus been devised and used as metamorphic or buffer structures comprising a succession of several layers. During heat treatments, however, if the various layers of such a composite substrate have different thermal expansion coefficients at the working temperatures, they will expand differently and induce expansion strains in the layer that will be formed thereon (and may perhaps also induce strain relaxation by overall deformation of the substrate, which thus becomes deflected).

The main difficulty that therefore arises is to find an epitaxy substrate having a structure that permits a wide choice of materials with a useful epilayer to be grown thereon, which offers:

good lattice matching with the material of the useful epilayer to be grown; and a thermal expansion coefficient close to that of the material of the useful layer to be formed at the said working temperatures.

It is especially necessary to obtain this type of substrate when it is desired to produce components made of Group III-V materials, for example for applications in optoelectronics, for which the level of the photovoltaic effects is controlled by the band structure of the Group III-V material. In general, the substrates known in the prior art must often meet at least two of the aforementioned criteria taken together.

The possible choices for epitaxy substrates suitable for achieving certain material and structural properties of the thin layers to be grown on their surface are therefore restricted, or even non-existent in certain cases. Thus, there is a need for additional substrates for this purpose, and these are now provided by the present invention.

SUMMARY OF THE INVENTION

The invention relates to a composite support designed to successfully receive a transfer layer made of a crystalline material so that the assembly forms an epitaxy substrate, with the support having a longitudinal plane of symmetry parallel to its principal surfaces and comprising a plurality of layers. The support includes a central first layer having a first thermal expansion coefficient at a specified temperature T and extending transversely on either side of the plane of symmetry; and at least one pair of lateral layers. The layers of each pair, one with respect to the other, have arrangements in the composite support that are substantially symmetrical with respect to the plane of symmetry; second thermal expansion coefficients at the temperature T that are substantially identical to one another; and thicknesses that are substantially identical to one another. The layers of the support are made of materials that are chosen in such a way that the composite support has an overall thermal expansion coefficient at the temperature T that is sufficiently close to the thermal expansion coefficient of the material of the transferred layer at the temperature T to avoid generating an excessive number of defects in the transfer layer.

Advantageously, the materials of the layers are chosen so that the composite support has an overall thermal expansion coefficient at several temperatures that is close to that of the material of the transfer layer at such temperatures. It is also useful for wherein the material of the layer of the composite support that is intended to support the transfer layer is chosen to have a lattice parameter that is sufficiently close to that of the material of the transfer layer to avoid generating high internal strain in the transfer layer. Preferably, the central layer is positioned between the lateral layers and is made of SiC with each of the lateral layers being the same and made of crystalline or polycrystalline AlN, SiC, sapphire, or Si material.

The invention also relates to a structure for electronic, optic or optoelectronic applications comprising an epitaxy substrate of the composite support described herein and a transfer layer of crystalline material provided upon the support. A preferred transfer layer is GaN. The transfer layer can include electronic components or a useful layer can be formed by crystalline growth on the transfer layer and the electronic components provided in the useful layer.

The invention also relates to a process for forming a transfer layer on a composite support as described herein. The method comprises conducting crystalline growth of a transfer layer on a growth substrate other than the composite support; bonding the transfer layer and growth substrate to the composite support; and removing the growth substrate to provide the transfer layer on the composite support.

Further, the invention relates to a process for forming a plurality of epitaxy substrates, which comprises forming a plurality of layers on a plurality of composite supports as described herein by using a wafer comprising a growth substrate and a multilayer structure on the growth substrate, the multilayer structure comprising a plurality of pairs of layers, each including the transfer layer and an intermediate layer subjacent to the transfer layer; removing layers from the multilayer structure with each removal conducted by implantation of atomic species into an intermediate layer in order to create therein a region of weakness in the vicinity of the implant depth; bonding to a composite support of the layer to be transferred; and supplying energy into the region of weakness, in order to detach the layer to be transferred from the multilayer structure and providing a remaining portion of the intermediate layer on the transferred detached layer. Then that portion of the intermediate layer remaining on the transferred detached layer is selectively etched to produce the epitaxy substrate; and the multilayer structure is prepared for use in a subsequent layer transfer. The preparing of the multiple layer includes providing an epitaxial nucleation layer for generating a new layer to be transferred. If desired, a plurality of crystalline growth layers can be provided on the plurality of transferred layers, so as to form a plurality of respective useful layers.

BRIEF DESCRIPTION OF THE DRAWINGS

Other aspects, objects and advantages of the present invention will become more clearly apparent on reading the following detailed description of preferred methods of implementing it, these being given by way of non-limiting example and with reference to the appended drawings in which.

DETAILED DESCRIPTION OF THE PREFERRED EMBODIMENTS

The present invention overcomes the prior art limitations by proposing a composite support intended to receive a transferred layer made of a material chosen from crystalline materials, so that the assembly forms an epitaxy substrate.

The invention thus produces a composite support (i.e., one comprising a plurality of layers) having a suitable thermal expansion coefficient close to that of the crystalline layer to be transferred thereto (i.e. in or on which layer electronic, optical or optoelectronic components will be produced), which it supports, at the working temperatures.

In addition, the invention produces an epitaxy substrate comprising a composite support that supports a layer that has been transferred thereto, this transferred layer forming a crystalline growth support with a useful layer.

Furthermore, the invention provides many more degrees of freedom than one had in the prior art, with regard to choice of the various materials constituting an epitaxy substrate, while greatly reducing or even removing, the restrictions associated with the risks of a substantial deflection appearing, which had to be taken into account in the prior art.

This makes it possible to choose constituent materials of the substrate from a wider range of materials, the choice being based fundamentally on the following criteria:
  the surface lattice parameter; and
  the overall thermal expansion coefficient of the substrate, in order to form, on the surface, a useful layer having the desired crystallographic and thermal expansion properties.

Also, the invention proposes a method of determining the materials and the structure of a substrate that makes it conceivable to consider the problem of the choice of lattice parameters separately from the problem of thermal expansion, which makes it possible to further increase the number of possible ways of producing a substrate having properties close to those desired for the useful layer to be formed on this substrate. And, on the surface of the epitaxy substrate according to the invention, a particularly thin useful layer having a crystal structure of high quality and with controlled elastic stresses is formed for use in optronic, electronic and optoelectronic applications.

Figure 1:
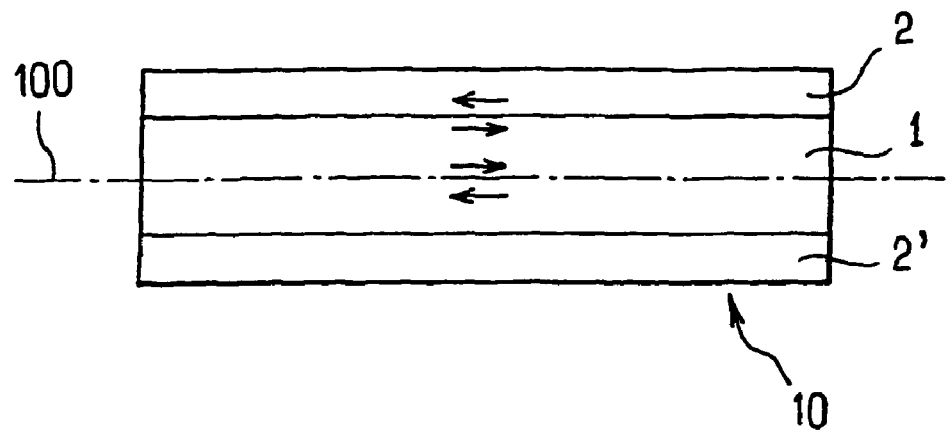
FIG. 1 shows a first composite support according to the invention, the substrate here being shown schematically in a cross-sectional view.

FIG. 1 shows a composite support 10 according to the invention for solving the problem of the difference in thermal expansion between the epitaxy substrate and the useful layer to be formed, and also the problems of deflection sometimes encountered with substrates of the prior art.

This composite support 10 has a longitudinal geometrical plane of symmetry 100.

The composite support 10 consists of:
  a central first layer 1 having a first thermal expansion coefficient at a specified temperature T and extending substantially symmetrically around the plane of symmetry 100; and
  a pair of lateral layers 2 and 2', one layer of each pair facing the other layer of the same pair:
    an arrangement in the composite support that is substantially symmetrical with respect to the plane of symmetry,
    a second, substantially identical, thermal expansion coefficient at the temperature T, and
    a substantially identical thickness.

This composite support 10 exhibits a symmetry with regard to the configuration of the layers with respect to the same plane of symmetry 100 since there exists as many layers above the plane 100 as below it, and since the layers of any one pair have substantially the same thicknesses facing each other.

There is also a symmetry in the distribution within the composite support 10 of the thermal expansions, at the temperature T, of the materials making up the layers with respect to the plane 100, given that the layer 2 has substantially the same thermal expansion coefficient as the layer 2'.

The strains associated with the differences in thermal expansion between the layers therefore cannot be partly relaxed by the bending of the composite support 10 so as to form a deflection, given that the layer 2' "compensates for" the asymmetry of thermal expansion existing between the layer 1 and the layer 2.

In one particular configuration of the composite support 10, the layer 2' does not perfectly compensate for the asymmetry of the thermal expansion existing between the layer 1 and the layer 2 so as to form a slight deflection in the composite support 10 corresponding substantially to the opposite deflection of the layer to be transferred thereto, in such a way that, when the layer is transferred, the composite support 10/layer to be transferred assembly has a deflection tending towards zero.

Figure 2:
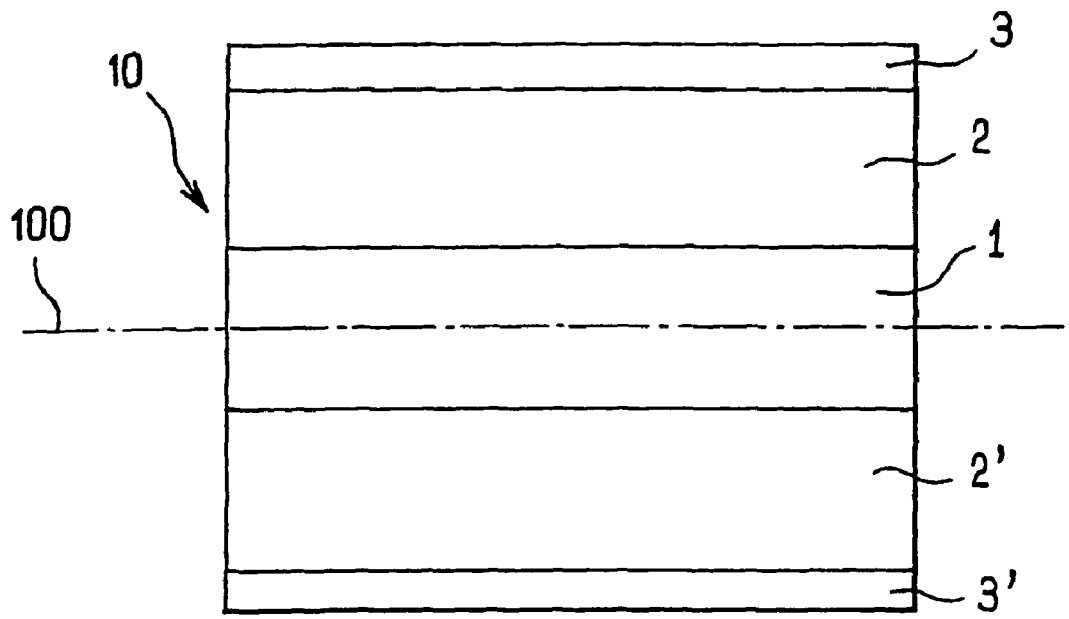
FIG. 2 shows a second composite support according to the invention, the composite support here being shown schematically in a cross-sectional view.

In all cases, shear stresses are created at the layer 2'/layer 1 interface and at the layer 1/layer 2 interface (they are shown in FIG. 2 by arrows).

To maintain structural quality of the upper layer 2, the difference in expansion between adjacent layers must not be too large, otherwise some of the interfacial strains in the layers 1, 2 and 2' will relax by the creation of plastic defects. However, these layers 1, 2 and 2' (and especially the layer 2 that is intended to receive the transferred layer) each have a typical thickness of the order of several microns or even several tens of microns, and therefore a thickness capable of confining these defects at its interface with the central layer 1.

Figure 3:
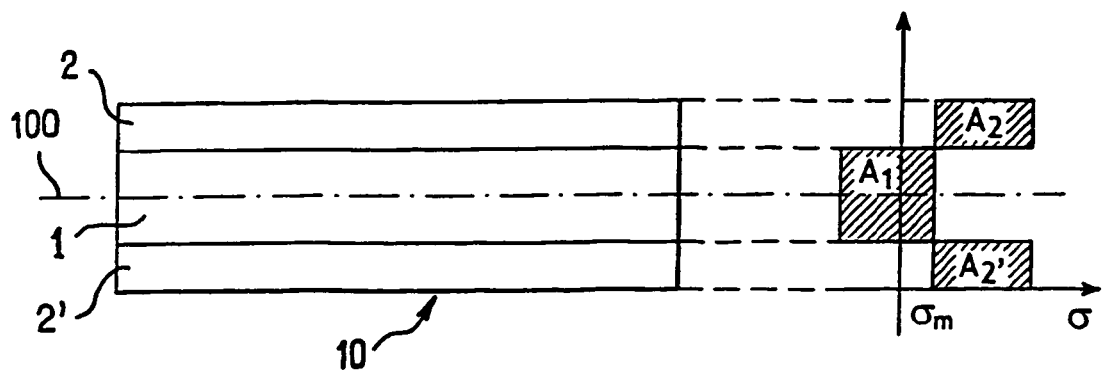
FIG. 3 shows the stress distribution through the thickness of the first composite support according to the invention.

FIG. 3 shows a graph of an example of the distribution of internal stresses (plotted on the x-axis, and denoted by σ) over the thickness (plotted on the y-axis) of the composite support 10 at a temperature T. The stresses in the central layer 1, in the upper layer 2 and in the lower layer 2' are shown in the graph by the areas $A_1$, $A_2$ and $A_{2'}$, respectively. The internal stresses appearing in a layer correspond to the free-expansion strains of the material making up this layer, these stresses deriving from the different expansion of the neighbouring layer.

Figure 4:
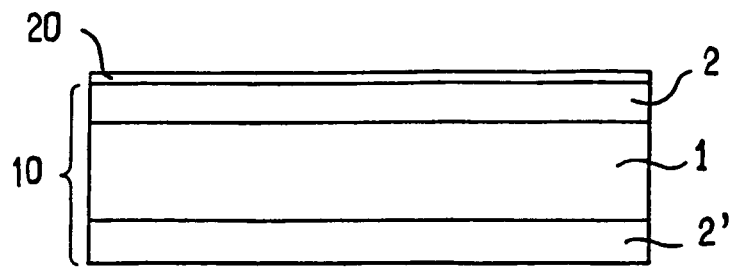
FIG. 4 shows an epitaxy substrate according to the invention.

As shown in FIG. 4, an epitaxy substrate 30 according to the invention has the form of a wafer, the surfaces of which are substantially planar. This epitaxy substrate 30 comprises a composite support 10 having a longitudinal plane of symmetry parallel to its principal surfaces; and a transferred layer 20 on the composite support 10.

The composite support 10 according to the invention consists of several layers. The various constituent layers of the composite support 10 typically each have a thickness of the order of 1 μm to 1000 μm typically of the order of 100 μm.

Thus, FIG. 4 shows that:

$A_2$ is substantially identical to $A_{2'}$;

$A_1$ is distributed in two substantially identical areas, each one on either side of the plane of symmetry 100. This graph therefore demonstrates the symmetrical distribution of the stresses with respect to the plane of symmetry 100 in a composite support 10 that is symmetrical in its layer configuration.

With such a structure of the composite support 10 according to the invention, the possible choices of materials constituting a composite support 10 with a low deflection are increased compared with a composite support 10 of the prior art for which the various expansions existing between the various materials constituting it must be taken into strict account, since the problem of the differences in expansion is solved by a "compensated expansion" solution.

FIG. 2 shows a composite support 10 composed of five layers according to the invention, a central main layer 1 having a thermal expansion coefficient $\alpha_1(T)$ and two pairs of layers 2-2' and 3-3' each having respective thermal expansion coefficients $\alpha_2(T)$ and $\alpha_3(T)$, the whole assembly having a structure and a layer configuration substantially symmetrical with respect to the plane of symmetry 100.

In the same way as the three-layer composite support 10 discussed with reference to FIG. 1, this five-layer composite support 10 exhibits a symmetry of thermal expansion with respect to the plane of symmetry 100.

This composite support 10 therefore has an expansion coefficient matched to the layer to be transferred, and only a slight deflection according to the invention.

Likewise, composite supports 10 consisting of more than five layers and exhibiting this symmetry of thermal expansion with respect to the plane of symmetry 100 are composite supports according to the invention.

Since the deflection problem is solved by the particular configuration of a composite support 10 according to the invention, the choice of materials will essentially be based on a surface lattice parameter criterion of the composite support 10 and an overall thermal expansion coefficient criterion. The expression "overall thermal expansion coefficient" is understood here to mean the thermal expansion coefficient that the composite support 10 would have if it were formed from a single material.

The method presented below is a preferred, but not limiting, method according to the invention for choosing the materials and the configuration of the layers making up the composite support 10. This method is divided into two phases:

(a) choice of a list of materials that can make up the upper layer of the composite support 10, this layer being intended to be adjacent to the layer to be transferred, based mainly on a lattice parameter sufficiently close to the material of the layer to be transferred;

(b) for each constituent material of the upper layer of the composite support 10 in the step (a), choice of a list of materials that can make up the other layers of the composite support 10, in such a way that the composite support 10 has, in the end, an overall expansion at the working temperatures which is close to the expansion of the constituent material of the layer to be transferred.

This method of determining the materials and the structure of the composite support 10 thus makes it possible to consider the problem of the choice of lattice parameter separately from the problem of the thermal expansion, thereby making it possible to further increase the possible ways of producing a composite support having properties close to those sought for the layer to be transferred on this composite support and therefore the eventual useful layer to be formed by epitaxy on the transferred layer.

Advantageously, the constituent materials of the layers of the composite support 10 are crystalline materials. Now, the expansion of a crystalline material usually varies to a first approximation linearly with temperature. The thermal expansion coefficient of each constituent crystalline layer of the composite support 10 therefore remains approximately constant with changes in temperature.

The overall thermal expansion coefficient $\alpha$ of the composite support 10 corresponding to the area expansion of the composite support 10 (or linear expansion if the surface of the composite support 10 has circular symmetry) at a given temperature is calculated for a number N of constituent layers of the composite support 10 by a linear formula of the type:

$$\alpha = f(\alpha_1, \alpha_2, \ldots, \alpha_N).$$

This formula also takes into account the thicknesses of the constituent layers of the composite support 10. The overall thermal expansion coefficient α of the composite support 10 therefore also changes with temperature in an approximately constant manner.

Figure 6:
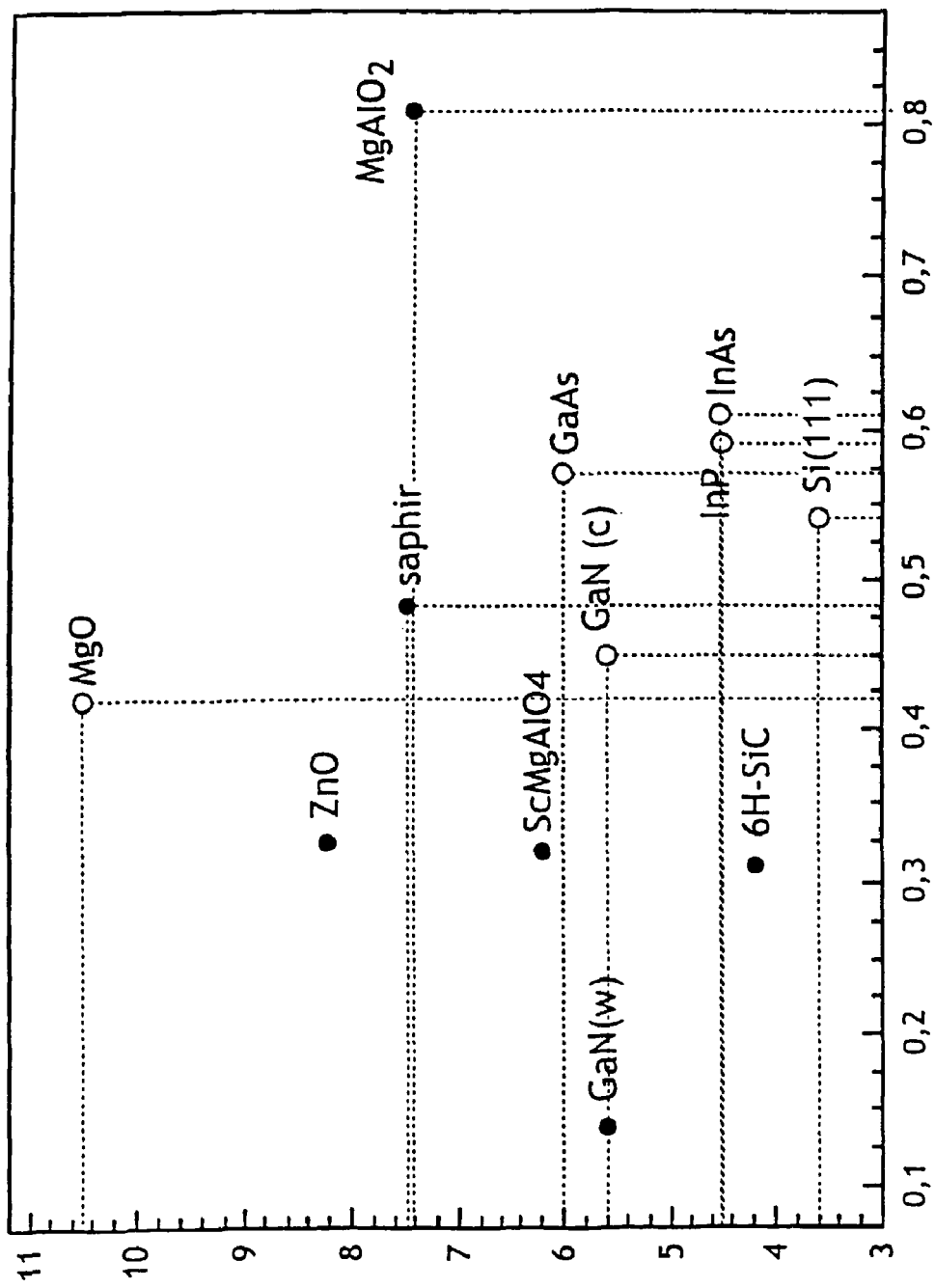
FIG. 6 shows a graph giving thermal expansion coefficients as a function of the lattice parameters for various materials.

FIG. 6 shows a graph in which lattice parameters expressed in nanometres are plotted on the x-axis and thermal expansion coefficients expressed in $10^{-6}K^{-1}$ are plotted on the y-axis. Crystalline materials lying within the graph are shown therein by circular spots:

materials of cubic structure by open circles;
  materials of hexagonal structure by filled circles.

Thus, for example, if it is desired to form a layer to be transferred made of cubic GaN material (indicated by GaN (c)), an upper layer of the composite support 10 will be chosen, according to phase (a) of the method, made of sapphire or MgO. In phase (b) of the method, by approximating the overall expansion coefficient of the composite support by the average of the sum of the thermal expansion coefficients of the constituent materials of the composite support 10, it may be seen that the average of the respective thermal expansion coefficients of 6H—SiC and sapphire gives roughly the thermal expansion coefficient of GaN.

The sapphire/6H—SiC/sapphire structure therefore constitutes a composite support 10 that is particularly suitable for the formation on this composite support 10 of a cubic GaN layer, since it possesses:

little deflection;
  a surface lattice parameter close to that of the GaN layer; and
  an overall thermal expansion close to that of GaN at the working temperatures.

Furthermore, the particularly high robustness of sapphire and SiC allows the thickness of the composite support 10 to be reduced compared with a composite substrate 10 made of less robust materials.

For certain desired final structures, comprising therefore the composite support 10 and the transferred layer 20, there is no need to take into account phase (a) in the method. This is especially the case in SeOI (Semiconductor On Insulator) structures in which a layer of insulation material separates the composite support 10 from the transferred layer.

The production of a composite support 10 according to the invention is advantageously carried out in two steps. A first step in the production of the composite support 10 consists in providing a wafer that will serve as base element for this production, this wafer being advantageously chosen to be made of bulk material. The wafer constitutes, for example, the said first layer of the composite support 10.

A second step in the production of the composite support 10 consists in forming the other layers, starting from the first layer provided in the first step, by deposition (of crystalline material, amorphous material, etc.) by ceramic production techniques, by sintering, etc. This layer formation advantageously includes an operation of transferring the layer to be formed from a donor substrate (made of bulk or multilayer material) onto one of the surfaces of an already formed layer of the composite support 10, this operation taking place in two successive steps:

bonding of the donor substrate to an already formed layer of the composite support 10; and
  removal of part of the donor substrate, the remaining part then constituting the layer to be transferred.

The bonding following the intimate contacting of the donor substrate with the already formed layer of the composite support 10 is advantageously effected by wafer bonding (molecular adhesion) between the two layers to be bonded. This bonding technique, together with variants, is described, for example, in the document entitled "*Semiconductor Wafer Bonding*" (Science and Technology, Interscience Technology) by Q. Y. Tong, and U. Gösele, Wiley & Sons. If necessary, the bonding is accompanied by a suitable pre-treatment of the respective surfaces to be bonded and/or an injection of thermal energy. Thus, for example, a heat treatment carried out during the bonding strengthens the bonds formed.

The bonding may also be strengthened by a bonding layer inserted between the two substrates to be bonded together. This bonding layer is applied to at least one of the two surfaces to be bonded together. Silicon oxide (also called silica or $SiO_2$) is a material that may be chosen for producing such a bonding layer, it being possible to produce it by oxide deposition or by thermal oxidation or by any other technique.

A surface finish step may be carried out before and/or after bonding, for example by means of one of the techniques described above. The removal of material preferably uses one of the following techniques, individually or in combination: chemical etching and/or chemical-mechanical etching, polishing, lapping. For example, it is possible to carry out optionally selective etching operations on the materials to be removed, using an "etch-back" process. This technique consists in etching these materials "from the rear" that is to say from the free face of the growth substrate for the layer to be transferred, in order at the end to preserve the layer to be transferred. Wet etching operations using etching solutions suitable for the materials to be removed may be carried out as an alternative. Dry etching operations may also be carried out in order to remove material, such as plasma etching or sputter etching. The etching operation(s) may also be only chemical or electrochemical or photoelectrochemical.

The etching operation(s) may be preceded or followed by a mechanical treatment such as lapping, polishing, mechanical etching or sputtering of atomic species. The etching operation(s) may be accompanied by a mechanical treatment, such as polishing, optionally combined with mechanical abrasive action in a CMP process. That part of the wafer 10 that it is desired to remove may thus be entirely removed by a single chemical technique or by a chemical-mechanical technique. This technique makes it possible in particular to maintain the surface quality and thickness uniformity of the layer to be transferred, close to those initially.

These techniques are proposed here by way of example, but they in no way constitute any limitation, the invention extending to all types of techniques that are capable of removing material in accordance with the process according to the invention. Whatever the material removal technique chosen, a step of finishing the surface of the composite support is advantageously carried out, for example by means of one of the techniques already mentioned. After the various layers of the composite support 10 have been formed using one of these techniques, the composite support 10 is then produced.

A first method of producing an epitaxy substrate 30 (as shown, for example, in FIG. 4) comprises crystalline growth of the layer 20 to be transferred on the composite support 10, for example by CVD epitaxy or MBE. This first method means that the composite substrate 10 has at least its upper surface made of crystalline material. This epitaxy may optionally be preceded by the formation of a nucleation layer. With reference to FIG. 4, a cubic GaN layer 20 to be transferred is thus grown epitaxially on a composite support 10 consisting of a sapphire layer 2'/6H—SiC layer 1/sapphire layer 2 structure.

A second method of producing an epitaxy substrate 30 comprises the following steps:
crystalline growth of the layer 20 to be transferred on a growth substrate other than the composite support 10;
bonding the composite support 10 to the layer 20 to be transferred; and
removal of material, the material to be removed being here the growth substrate and possibly part of the layer 20 to be transferred.

As previously, the bonding may be carried out with or without a bonding layer.

The removal of material may be carried out using one of the three following techniques. A first material removal technique comprises:
formation, in the growth substrate for the layer to be transferred, of a weak interface by forming at least one porous layer by anodization, by implantation of atomic species or by any other porosification technique, as described for example in U.S. Pat. No. 6,200,266; and
supplying energy into the weak layer, such as a mechanical treatment, or another injection of energy, in order to detach the layer to be transferred at the weak layer.

To form a weak layer within the growth substrate for the layer to be transferred, the porous layer is advantageously formed on a wafer of a single-crystal material, and then secondly a layer of non-porous crystalline material is grown on the porous layer, the non-porous material having substantially the same lattice parameter as that of the wafer, the said growth substrate then consisting of the wafer, the porous layer and the non-porous Si layer.

A second material removal technique called the SMART-CUT® process, can also be used here, this process comprising the following steps:
implantation, before the bonding, into the layer to be transferred or into its growth substrate, of the atomic species (such as hydrogen or helium ions or both) for forming a region of weakness at a depth close to the depth of implantation; and
then an injection of energy, after bonding, into the region of weakness, such as a thermal and/or a mechanical treatment, or another injection of energy, in order to detach the layer to be transferred in the region of weakness.

Advantageously, the region of weakness is subjected to a heat treatment during or after implantation in order to further weaken it. This non-limiting material removal technique makes it possible to remove, rapidly and en bloc, a substantial portion of the growth substrate for the layer to be transferred. It also allows the possibility of reusing the portion removed from this growth substrate in another process, such as for example, a process according to the invention. The known SMART-CUT® technique is described, for example, in a number of works dealing with wafer reduction techniques, such as for example that by Jean-Pierre Colinge "*Silicon-On-Insulator Technology: Materials to VLSI*", 2nd edition, Kluwer Academic Publishers, pages 50, 51.

A third material removal technique that can be employed is chemical or chemical-mechanical etching "from the rear". A preferred material removal technique according to the invention comprises the use of one of these three types of material removal, followed by selective etching between the material of the remaining growth substrate and the layer 20 to be transferred, thus making it possible to remove the remaining material on the layer 20 to be transferred. The selective chemical etching may be carried out by wet etching, employing an etching solution suitable for the materials to be etched. The selective chemical etching may be carried out by dry etching, such as plasma etching or sputter etching. The etching may also be only chemical, electrochemical or photoelectrochemical.

The layer 20 to be transferred constitutes, in this situation, a stop layer for the etching of the remaining part of the growth substrate after material removal using one of the three techniques. In general, the etching selectivity of a layer B with respect to a layer A is quantified by a selectivity factor given by the ratio:

$$\frac{\text{etch rate of the layer } A}{\text{etch rate of the layer } B}.$$

The chemical etchants must therefore be chosen so as to maximize this ratio in the case in which the layer A is the layer to be transferred and the layer B is the remaining part of the growth substrate. Thus, the layer 20 to be transferred will be hardly etched, or even not etched at all, by these chemical etchants.

By implementing such a preferred technique according to the invention, it is thus possible to form, on the composite support 10, a particularly thin layer with a structure similar to the initial structure obtained during its growth on the growth substrate. By implementing such a technique, it is possible to form, on the composite support 10, a layer 20 so thin that it has a substantially elastic structure in such a way that it follows the slightest deformations of the composite support 10. A layer about 10 nanometers in thickness may thus be formed. In the latter situation, a composite support 10 according to the invention is highly advantageous, especially as it exhibits little deflection.

Figure 5:
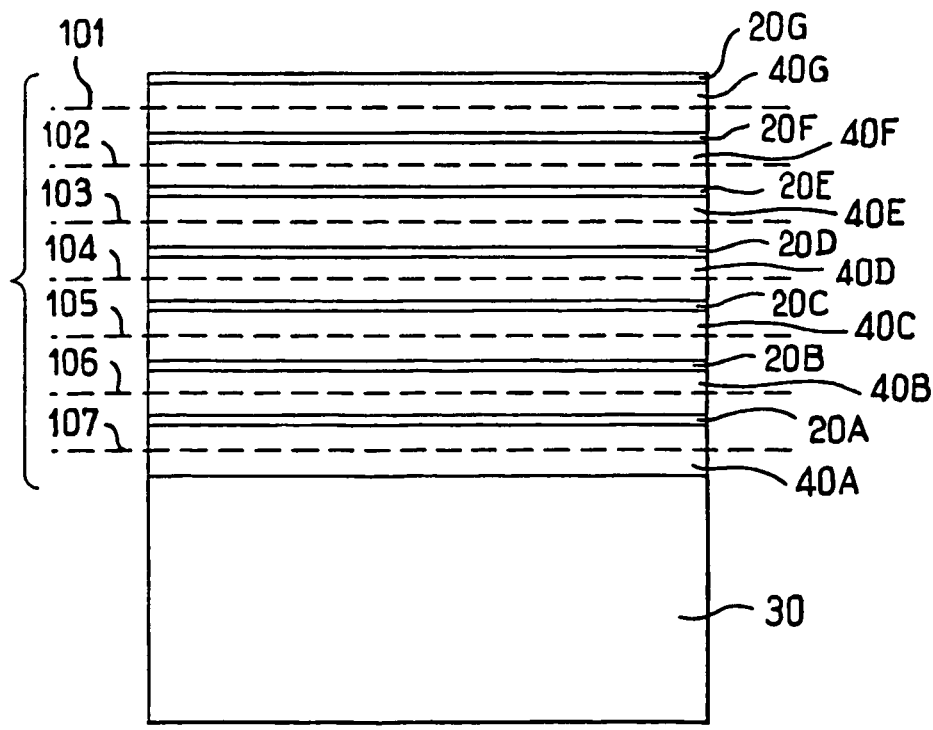
FIG. 5 shows a growth substrate from which thin layers are removed and transferred on to a composite support according to the invention.

FIG. 5 shows a process for producing a plurality of epitaxy substrates 30 (such as, for example that shown in FIG. 4) by the multi-removal of thin layers 20A, 20B, 20C, 20D, 20E, 20F and 20G in a multilayer structure I grown epitaxially on a growth substrate 30, so as to transfer them each on to a composite support 10 according to the invention. The multilayer structure I comprises the thin layers 20A, 20B, 20C, 20D, 20E, 20F and 20G that alternate respectively with intermediate layers 40A, 40B, 40C, 40D, 40E, 40F and 40G, the whole assembly having been advantageously grown epitaxially, layer by layer, starting with the growth substrate 50, using growth techniques such as CVD or MBE.

A preferred multi-removal process according to the invention includes a step that comprises the following operations:
(A) implantation of atomic species into the intermediate layer 40G so as to create therein a region of weakness 101 in the vicinity of the implant depth;
(B) bonding of the layer 20G to the composite support 10 according to the invention;
(C) injection of energy into the region of weakness 101 in order to detach the layer 20G to be transferred and that part of the intermediate layer 40G located between the region of weakness 101 and the layer 20G, and thus to remove the layer 20G to be transferred;
(D) selective etching of the remaining part of the intermediate layer 40G on the detached layer 20G to be transferred, thus producing a first epitaxy substrate 30; and
(E) removal of the remaining part of the intermediate layer 40G, so as to recycle the multilayer structure, the removal possibly being carried out for example by selective etching.

A multilayer structure I' finally obtained then consists of the following layers:

20F/40F/20E/40E/20D/40D/20C/40C/20B/40B/20A/40A.

Steps substantially identical to the above step may then be carried out in order:

to remove, respectively and in succession the thin layers 20F, 20E, 20D, 20C, 20B and 20A relative to the respective regions of weakness 102, 103, 104, 105, 106 and 107 in order to transfer them to the respective second, third, fourth, fifth and sixth composite supports 20, so as to form respective second, third, fourth, fifth and sixth epitaxy substrates 30; and to recycle the respective multilayer structures after removal so that a subsequent removal is possible.

This multilayer structure I is particularly advantageously used when the formation of a layer 20 to be transferred requires a growth substrate 50 that is complex to produce, such as a growth substrate 50 comprising metamorphic layers. With this preferred multi-removal process, such a growth substrate 50 is used for several removal operations. This therefore makes the process profitable, especially as regards the economic cost that such a growth substrate 50 represents.

In an even more advantageous configuration, this growth substrate 40 is protected by a stop layer for the selective chemical etching of the lower layer of the multilayer structure I, which makes it possible, once the multilayer structure I has been entirely consumed by the various removal and recycling operations, to smooth the surface of the growth substrate 40 by a suitable selective etching operation and to possibly repeat the formation of another multilayer structure I for other multi-removal operations.

Optionally, electronic or optoelectronic components may be produced in the layer 20 to be transferred, before or after the layer has been transferred. Optionally, crystalline growth of a useful layer (not shown) is carried out on the transferred layer 20 of the epitaxy substrate 30.

Electronic or optoelectronic components may be produced in this useful layer, before or after transfer of the layer.

The present invention is particularly suitable for constituent alloys of the layer 20 to be transferred that are chosen from the family of III-V materials or II-VI materials, but it can also be applied to IV-IV alloys. In the layers made of crystalline or semiconductor materials presented in this document, other constituents may be added thereto, such as carbon with a carbon or diamond concentration in the layer in question that is substantially less than or equal to 50% or more particularly, with a concentration of less than or equal to 5%.

The composite support 10 can be formed from all types of materials that are capable, in combination, of achieving the physical properties of the composite substrate (especially a thermal expansion coefficient matched to the layer to be transferred thereto). It should be pointed out that, in the case of alloy materials, the chosen alloys may be binary, ternary, quaternary or of higher order.

What is claimed is:

1. A structure for electronic, optic or optoelectronic applications comprising an epitaxy substrate consisting essentially of a composite support,
an oxide bonding layer and
a transfer layer of crystalline material,
wherein the composite support has a longitudinal plane of symmetry passing though a central layer and parallel to its principal surface and comprises
a plurality of layers consisting of crystalline or polycrystalline materials including
the central layer having a first thermal expansion coefficient at a specified temperature T and extending transversely on either side of the plane of symmetry; and
one or more pairs of lateral layers, having substantially identical thicknesses, with the layers of each pair having second thermal expansion coefficients at the temperature T that are different from the first thermal expansion coefficient of the central layer, and
with the layers of each pair made of materials, thicknesses and arrangements about the central layer to provide the composite support with symmetry of thermal expansion coefficients about the longitudinal plane of symmetry and with an overall thermal expansion coefficient at the temperature T that is sufficiently close to the thermal expansion coefficient of the material of the transfer layer to avoid deflection, and
wherein the transfer layer is bonded to a lateral layer of the composite support through the oxide bonding layer inserted between them.

2. The structure of claim 1, wherein the transfer layer is GaN.

3. The structure of claim1, wherein the composite support is a three-layer support which consists of:
a central layer made of SiC; and
a pair of lateral layers, each made of crystalline or polycrystalline SiC, sapphire, or Si material.

4. The structure of claim 1, wherein the transfer layer includes electronic components.

5. The structure of claim 1, further comprising a useful layer formed by crystalline growth on the transfer layer.

6. The structure of claim 5, wherein the useful layer includes electronic components.

7. The structure of claim 1, wherein the materials of the layers are chosen so that the composite support has an overall thermal expansion coefficient at several temperatures that matches that of the material of the transfer layer at such temperatures.

8. The structure of claim 1, wherein the materials of the layers of the composite support are chosen to provide a lattice parameter that avoids generating high internal strain in the transfer layer.

9. The structure of claim 1, wherein the central layer is positioned between the lateral layers and is made of SiC with each of the lateral layers being the same and made of crystalline or polycrystalline AlN, sapphire, or Si material.

10. The structure of claim 1, wherein the central layer is a made of SiC.

11. The structure of claim 1, wherein each of the lateral layers is the same and made of crystalline or polycrystalline AlN, sapphire, or Si material.

12. The structure of claim 1, wherein the lateral layer of the composite support that is opposite to the lateral layer that is bonded through the oxide bonding layer to the transfer layer has an exposed surface.

13. The structure of claim 1 wherein the at least one of more pairs of lateral layers consists of only one pair of lateral layers, the one pair of lateral layers being selected so as to provide symmetry of thermal expansion coefficients about the longitudinal plane of symmetry.

14. The structure of claim 1 wherein the at least one of more pairs of lateral layers consists of two or more pairs of lateral layers, the two pairs of lateral layers being selected to as to provide symmetry of thermal expansion coefficients about the longitudinal plane of symmetry.

15. The structure of claim 1 wherein the central layer and each lateral layer have thicknesses from several microns to several tens of microns.

* * * * *